United States Patent
Cautereels

(10) Patent No.: US 7,307,428 B2
(45) Date of Patent: *Dec. 11, 2007

(54) METHOD FOR SINGLE ENDED LINE TESTING AND SINGLE ENDED LINE TESTING DEVICE

(75) Inventor: Paul Henri Marie Cautereels, Hingene (BE)

(73) Assignee: Alcatel, Paris (FR)

( * ) Notice: Subject to any disclaimer, the term of this patent is extended or adjusted under 35 U.S.C. 154(b) by 0 days.

This patent is subject to a terminal disclaimer.

(21) Appl. No.: 11/525,970

(22) Filed: Sep. 25, 2006

(65) Prior Publication Data

US 2007/0013384 A1     Jan. 18, 2007

Related U.S. Application Data

(63) Continuation of application No. 10/882,219, filed on Jul. 2, 2004, now Pat. No. 7,119,546.

(30) Foreign Application Priority Data

Jul. 3, 2003     (EP)     ................................. 03291656

(51) Int. Cl.
G01R 31/11     (2006.01)
H04M 1/24     (2006.01)

(52) U.S. Cl. ................. 324/534; 324/533; 324/638; 324/642; 379/1.01; 379/1.04; 370/241

(58) Field of Classification Search ........... 324/533, 324/534, 637–639, 642
See application file for complete search history.

(56) References Cited

U.S. PATENT DOCUMENTS 4,649,335 A     3/1987     Lassaux et al.
5,000,568 A     3/1991     Trutna et al.
5,606,664 A *   2/1997     Brown et al. ............... 709/224
6,055,268 A *   4/2000     Timm et al. ................ 375/229
6,566,889 B2    5/2003     Warke
6,657,437 B1    12/2003    LeCroy et al.
6,781,386 B2 *  8/2004     Le Henaff .................. 324/534
6,867,600 B1 *  3/2005     Iskanius et al. ............. 324/646
6,985,444 B1 *  1/2006     Rosen ........................ 370/241
7,054,377 B1 *  5/2006     Betts ......................... 375/265
7,119,546 B2 *  10/2006    Cautereels ................... 324/534
2005/0008068 A1 1/2005     Stegherr
2005/0163287 A1* 7/2005    Ouyang et al. ................ 379/3
2006/0251221 A1* 11/2006   Rosenberg ............... 379/22.01

FOREIGN PATENT DOCUMENTS

DE     195 28 698 C1     5/1997
DE     101 54 937 C1     11/2002
GB     2 307 050 A       5/1997
WO     WO 02/25299 A1    3/2002

OTHER PUBLICATIONS

"TDR Tutorial—Introduction to Time Domain Reflectrometry", Granite Island Group, 2002, pp. 1-6.

* cited by examiner

Primary Examiner—Anjan Deb
Assistant Examiner—John Zhu
(74) Attorney, Agent, or Firm—Sughrue Mion Pllc.

(57) ABSTRACT

A single ended line testing method for qualifying an electrically conducting line, including the steps of sending a plurality of randomized excitation signals from a first end of the line towards a second end of the line, subsequently taking measurements, at the first end of the line, of each reflection of the plurality of randomized excitation signals, and then inversely randomizing the measurements. Line qualification is determined based on an average of the inversely randomized measurements.

14 Claims, 2 Drawing Sheets

METHOD FOR SINGLE ENDED LINE TESTING AND SINGLE ENDED LINE TESTING DEVICE

This application is a continuation of U.S. patent application Ser. No. 10/882,219, filed on Jul. 2, 2004, now U.S. Pat. No. 7,119,546, the entire disclosure of which is incorporated herein in its entirety. The present application also claims priority from European application No. 03291656.1 filed Jul. 3, 2003, which is also incorporated herein by reference.

BACKGROUND OF THE INVENTION

1. Field of the Invention

The present invention relates to a method and a device for single ended line testing for qualifying an electrically conducting line.

2. Description of the Related Art

Such a subject is already known in the art, e.g. from "TDR tutorial—Introduction to Time Domain Reflectrometry". This document is published by the Granite Island Group in 2002 at the URL: www.tscm.com. There it is disclosed that a single ended line testing method, called Time Domain Reflectometry, is used for determining characteristics of a cable from measurements at one end of this cable. In this single ended line testing method, the Time Domain Reflectometry, further referred to as TDR, a pulse of energy is transmitted down the cable. When such a pulse reaches the end of the cable, or any discontinuity along the cable, part or all of the pulse energy is reflected back to the sending source. So at the same location where one injected the pulse, one can measure the reflected energy.

For Fault location based on this single ended line testing method such a single ended line testing system measures the time it takes for the signal to travel down the cable, see the problem, and reflect back. The single ended line testing system then converts this measured time to distance from this side of the cable and displays the information as a waveform and/or distance reading. Such a measurement is executed by using a plurality of excitation signals sent from the source towards the other end of the line.

Moreover from these reflected pulses, one can not only deduce the position of the discontinuity (based on the time delay of the reflected pulse), but furthermore other characteristics of the cable such as topology, cable losses and achievable bitrates with xDSL modems can be extracted taking into account all properties of the reflected pulse.

Since the reflected pulses are very small due to travelling twice the distance to the discontinuity (back and forth), these reflections are often obscured by (external) noise sources.

Averaging over different measurement results, using the same excitation signal, lowers the external random noise effects e.g. Xtalk, environmental noise. However, averaging will not reduce the non-linearities or other noise sources that are synchronous with the applied excitation signal. Since the non-linearities are a (complex) function of the applied excitation signal, these non-linearities will behave as deterministic noise. It is noise because these components are undesirable and it is deterministic because this noise component is related to the excitation signal. Hence, by averaging over different measurements one will not lower the undesirable effect of non-linearities.

SUMMARY OF THE INVENTION

An aspect of the present invention is to provide a single ended line testing method of the above known type but wherein the effect of non-linearities is reduced.

According to the invention, this aspect is achieved by providing a single ended line testing method for qualifying an electrically conducting line, the method including sending a plurality of excitation signals from a first end of a line towards a second end of the line, performing measurements, at the first end of the line, of each reflection of said plurality of excitation signals sent towards the second end of the line, determining an average of all the measurements of reflections of the excitation signals and determining from the average a qualification of the line, wherein before sending a plurality of excitation signals, randomizing each excitation signal of the plurality of excitation signals, and performing an inverse randomization on each measurement of reflection.

According to the invention, this aspect is further achieved by providing a single ended line testing device for qualifying an electrically conducting line, the single ended line testing device including a signal generating means adapted to send a plurality of excitation signals from a first end of the line towards a second end of the line, a measuring means adapted to perform measurements, at the first end of the line, of reflections of said plurality of excitation signals sent towards the second end of the line, an averaging means, coupled with an input to an output of the measuring means and adapted to determine an average of all measurements of the reflections of the plurality of excitation signals, and a qualifying means adapted to determine from the average a qualification of the line, wherein the single ended line testing device further includes a randomization means coupled with an input to an output of the signal generating means and adapted to randomize each excitation signal of the plurality of excitation signals before sending the plurality of excitation signals, and an inverse randomization means coupled between the measuring means and the averaging means and adapted to perform an inverse randomization on each measurement of the reflections of the plurality of excitation signals.

Indeed, by before sending a plurality of excitation signals, randomizing each of the excitation signals, the excitation signal is decoupled from the higher order harmonics of the excitation signal and by subsequently, at measuring the reflections of the excitation signals, performing an inverse randomisation on all measurement of reflections the reflections are recovered and all are the same again. However, by inverse randomizing the higher order harmonics, these are still different for each measurement. By then averaging over these measurements one can lower the effect of all noise sources, because averaging over the same reflections results in the same reflection and averaging over a number of different measurements with respect to the higher order harmonics results in a reduction of the higher order harmonics.

The randomizing of the excitation signal is based on randomizing a phase of the excitation signal. The application of phase randomization allows the application of small phase angle variations in the randomization providing with very much alternatives for randomization. The main advantage of phase randomization, is the fact that the PSD (power spectral density) and the power of the excitation signal can be kept constant. The PSD and the power of the excitation signal are often limited to some maximum values (due to technical limitations or regulations). By performing all measurements with an excitation signal that corresponds to these maximal values of PSD and power, one can make sure that the signal to noise ratio of the individual measurements can be maximised.

The randomizing of the excitation signal is based on randomizing an amplitude of the excitation signal. The application of amplitude randomization allows the application of more simple implementations.

The randomizing of the excitation signal is based on randomizing a both a phase and an amplitude of the excitation signal.

It is to be noticed that the term 'comprising', used in the claims, should not be interpreted as being restricted to the means listed thereafter. Thus, the scope of the expression 'a device comprising means A and B' should not be limited to devices consisting only of components A and B. It means that with respect to the present invention, the only relevant components of the device are A and B.

Similarly, it is to be noticed that the term 'coupled', also used in the claims, should not be interpreted as being restricted to direct connections only. Thus, the scope of the expression 'a device A coupled to a device B' should not be limited to devices or systems wherein an output of device A is directly connected to an input of device B. It means that there exists a path between an output of A and an input of B which may be a path including other devices or means.

BRIEF DESCRIPTION OF THE DRAWINGS

The above and other aspects and features of the invention will become more apparent and the invention itself will be best understood by referring to the following description of an embodiment taken in conjunction with the accompanying drawings wherein.

DETAILED DESCRIPTION OF THE ILLUSTRATIVE NON-LIMITING EMBODIMENTS OF THE INVENTION

Figure 1:
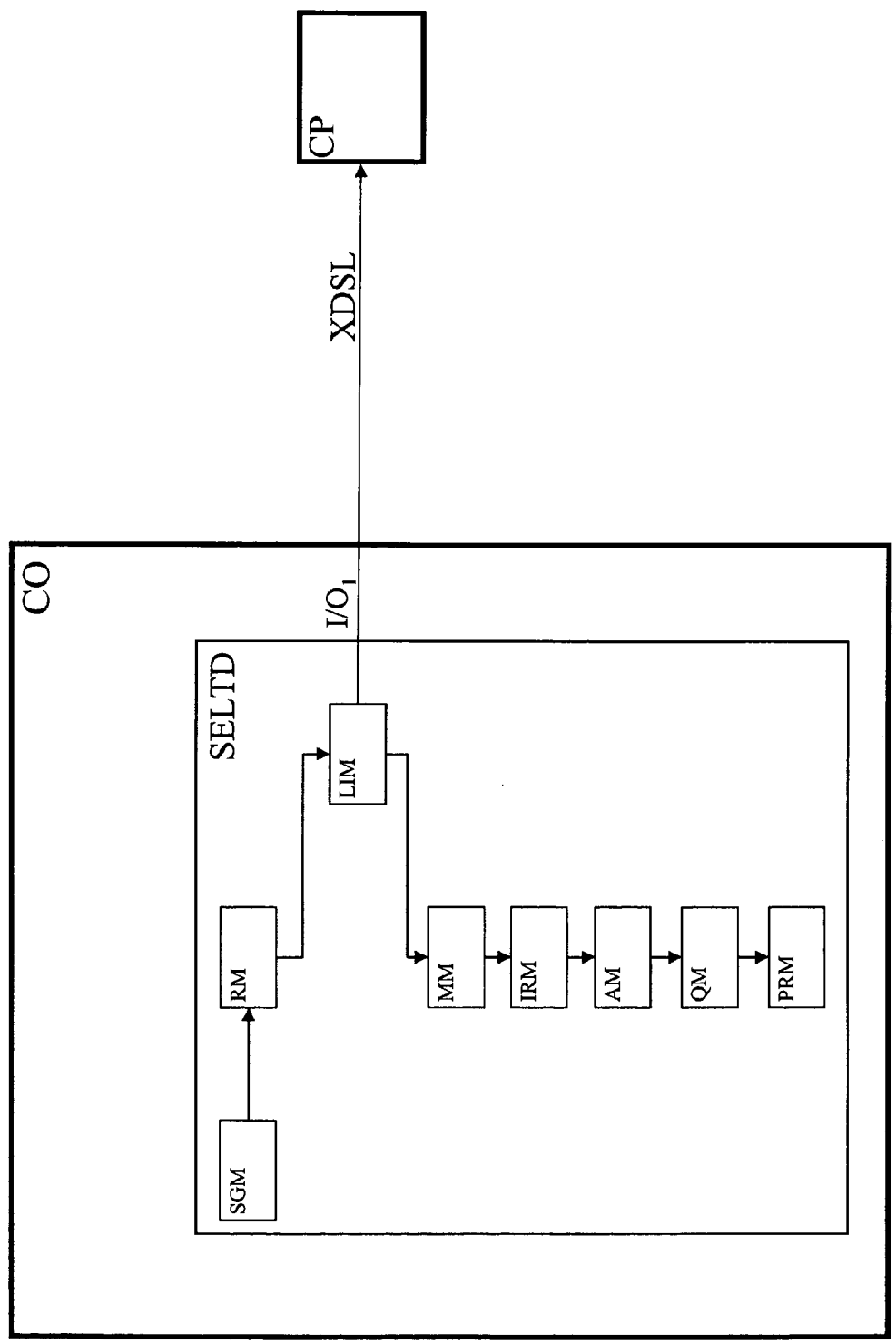
FIG. 1 represents a Single ended line-testing device in an XDSL access network.

In the following paragraphs, referring to the drawings, an implementation of the method and the related device according to the present invention will be described. In the first paragraph of this description the main elements of this network as presented in FIG. 1 are described. In the second paragraph, the connections between the before mentioned network elements and described means are defined. In the succeeding paragraph the actual execution of single ended line testing is described.

The XDSL access network of the present invention comprises a central office CO and a Customer Premise CP coupled by an XDSL line. At the CO location, a single ended line testing device SELT is connected to this XDSL line XDSL.

Although there is usually more than one XDSL line coupled to the Central Office in such an access network, only these elements are described in this embodiment in order to keep simplicity.

The Single ended line testing device first comprises a signal generating means SGM that is adapted to send a plurality of excitation signals from the CO end of said line towards a CP end of said line, this signal generating means SGM may be a multi-sinewave generator. The single ended line-testing device SELT additionally comprises a randomization means RM that is able to randomize each excitation signal of said plurality of excitation signals and a line interfacing module LIM that is adapted to connect the single ended line-testing device SELT to the XDSL line.

Further the single ended line-testing device SELT comprises a Measuring means MM, that is able to perform a measurement, at the first end of the XDSL line, of a reflection of each of the excitation signals that are sent towards the CP end of the XDSL line. The Single ended line-testing device SELT further comprises an Inverse Randomization means IRM that is adapted to Perform an inverse randomization on each measurement of the reflected signal and an Averaging means AM that is adapted to average all measurements of reflections of the excitation signals. Next, the single ended line-testing device SELT comprises a Qualifying means QM for determining from the average a qualification of the XDSL line. The qualification may be amongst others determining a defect of the XDSL-line, a topology, cable losses or achievable bitrates with xDSL modems.

Finally, there is presentation means PRM for presenting the results of the qualification at a screen of the line-testing device SELT.

The line interfacing module LIM of the Single ended line testing device SELT has an input/output-terminal that is at the same time an input/output-terminal I/O1 of the Single ended line testing device SELT. The line interfacing module LIM is further coupled with an input to an output of the randomization means RM which in its turn is coupled with an input to an output of the Signal generating means SGM.

Furthermore, the line-interfacing module LIM is coupled with an output to an input of the Measuring means MM that in its turn is coupled with an output to an input of the Inverse Randomization means IRM. The Averaging means AM is coupled between the Inverse Randomization means IRM and the Qualifying means QM. The Qualifying means QM, further is coupled with an output to an input of the Presentation means. It is here assumed that the signal generator produces a multi-sinewave for testing the XDSL line. For each of such a generated excitation signal at first the phase of the different sines that compose the excitation signal is randomized by the randomization means RM and subsequently sent out over the XDSL line towards the Customer Premise end of the line. The signal travels along the XDSL line towards the CP side and is reflected back at the CP side or by a defect in the line. Anyway, a reflected signal is received at the line interfacing module LIM of the Single ended line testing device SELT. The measuring means MM executes measurements of the reflections of the signals that are sent towards the CP side. Subsequently the Inverse Randomization means IRM performs an inverse phase randomization on each said measurement.

The Averaging means subsequently determines the average over all reflections of applied excitation signal. The qualifying means QM then based on the averaging determines a qualification of the line (such as defects, topology, line attenuation, attainable bitrate with xDSL system . . . ). The presentation means finally presents the related characteristics as extracted by the qualification means, on the screen of the single ended line testing device SELT.

Real implementations could mix non-randomized and randomized measurement: the SELT system performs N measurements without randomizing the excitation signal. The average over these measurements is computed and this result is considered as one measurement result. This procedure is then repeated M times, but now each time with another randomization of the excitation signal. Optimal values of N and M can be derived which will result in maximal measurement accuracy and minimal measurement time.

Figure 2:
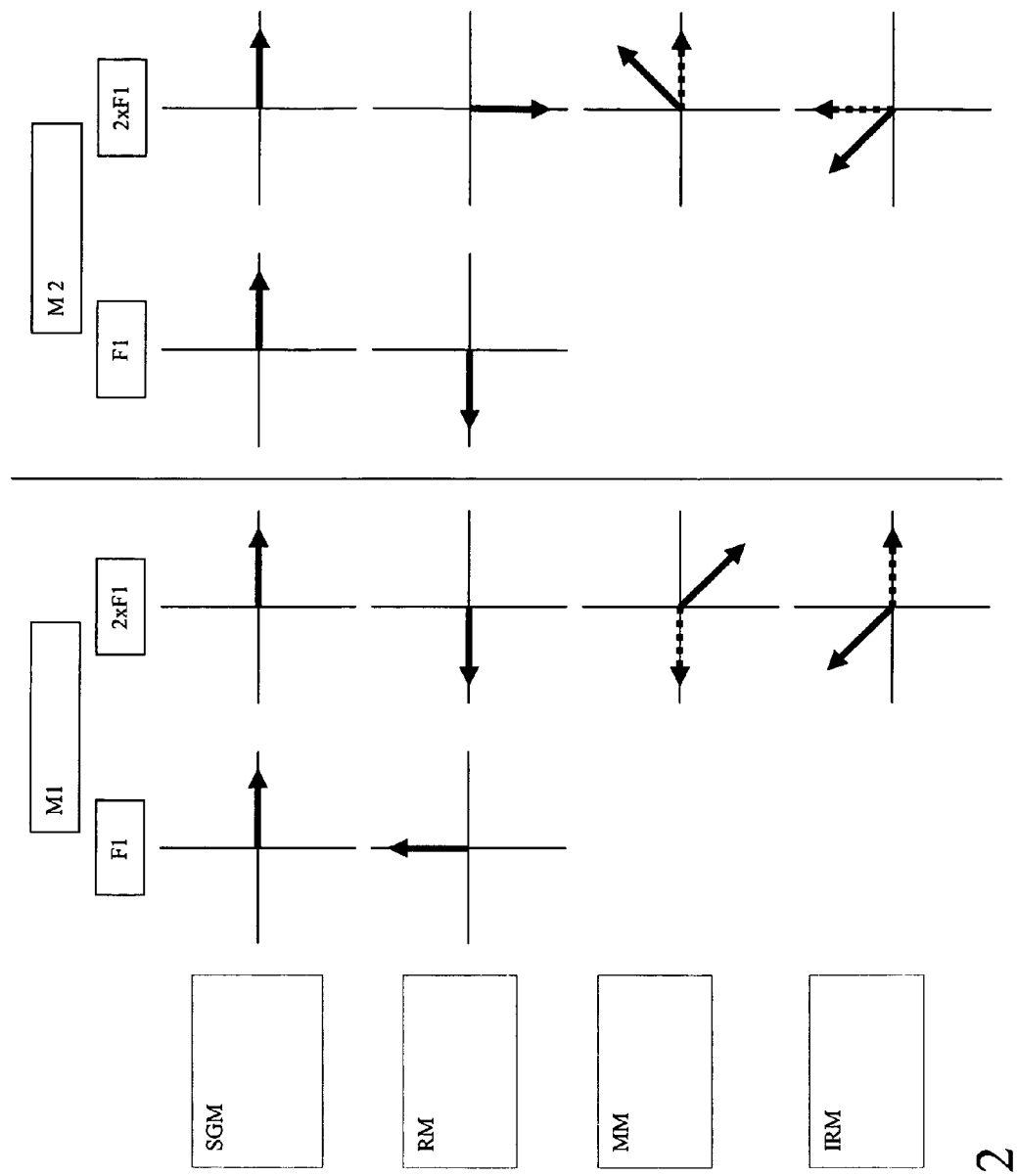
FIG. 2 represents the signals related to the signal between the functional blocks.

In order to further clarify the operation of the described embodiment, in this paragraph it is shown how the method of the present invention can be used to reduce the effect of second order non-linear distortion in single ended line-testing. The measurement method used is the one pictured in FIG. 1. In FIG. 2 we show the signals that are transferred between the different functional blocks of the embodiment. In this figure, you can find the results of 2 different measurements, each with different excitation signals applied to the Line Interface Module, due to the randomization process. For each measurement the signals are shown for 2 different frequencies to be able to clearly see the effect of second order non-linear distortion. Note that of course other frequencies can be involved in the measurement but showing only 2 of them (frequency F1 and 2×F1) allows us to show how this method can reduce second harmonics. In FIG. 2, all signals are represented as vectors (phasors) in the complex plane.

For measurement 1 M1, the output of the Signal Generating Means SGM is shown for frequency F1 and 2×F1. The amplitude of both is the same and both have a phase of 0 degrees. The Randomization Means RM (assuming it only adapts the phase) will change the phase of both sinewaves. This is reflected in the graph as a rotation of the phasor (90 degrees counterclockwise for the signal with frequency F1, 180 degrees for the signal with frequency 2×F1). The output of the Measurement Means MM is only shown at frequency 2×F1 (as the object is to show that second order harmonics are reduced). Here the output of the Measurement Means MM is decomposed in 2 components: the solid line shows the result we are interested in (the output due to the excitation signal at frequency 2×F1), the dotted arrow shows the effect of the second harmonic of the excitation signal at frequency F1. At the bottom, we finally show the output of the Inverse Randomization Means IRM: since a rotation of 180 degrees was applied during the randomization process, we have to undo this effect by rotation once more over 180 degrees. On the right hand side, the results of a second measurement M2 are shown. For this measurement only the randomization parameters are different: the signal at frequency F1 is rotated 180 degrees and the signal at frequency 2×F1 is rotated 90 degrees clockwise.

If the outputs of the Inverse Randomization Means IRM are compared for these 2 measurements, it can be seen that the desired signal (the solid arrow) is identical in both cases, where the phase of the non-linearities (the dotted arrow) are clearly different. So it is clear that, by averaging over the different outputs of the Inverse Randomization Means, the effect of second harmonics can be reduced. It is clear that the more measurements are done in this way, the better the effect of second harmonic distortion can be reduced.

Similar pictures can be drawn also for higher order harmonics and for distortion due to intermodulation of different frequencies.

It is further assumed that the same procedure as before can be executed when using a randomization of the signal based on amplitude randomization or combination of both the amplitude randomization and a phase randomization. It is further to be noticed that although the described embodiment is a telecommunications system, the present invention is applicable in single ended line testing systems in general.

It is to be noted that the method of the present invention additionally may be used for transfer function measurement.

A final remark is that embodiments of the present invention are described above in terms of functional blocks. From the functional description of these blocks, given above, it will be apparent for a person skilled in the art of designing electronic devices how embodiments of these blocks can be manufactured with well-known electronic components. A detailed architecture of the contents of the functional blocks hence is not given.

While the principles of the invention have been described above in connection with specific apparatus, it is to be clearly understood that this description is made only by way of example and not as a limitation on the scope of the invention, as defined in the appended claims.

What is claimed is:

1. A single ended line testing method comprising the steps of:
   sending a plurality of randomized excitation signals from a first end of an xDSL line towards a second end of said line;
   performing measurements, at said first end of said line, corresponding to each reflection of said plurality of randomized excitation signals sent towards said second end of said line;
   performing an inverse randomization on each said measurement of reflection to obtain inversely randomized measurements, and
   determining a qualification of said line based on an average of a plurality of said inversely randomized measurements.

2. The single ended line testing method according to claim 1, wherein said randomized excitation signals are randomized in phase.

3. The single ended line-testing method according to claim 1, wherein said randomized excitation signals are randomized in amplitude.

4. A single ended line testing method according to claim 1, wherein said randomized excitation signals are randomized in both phase and amplitude.

5. The single ended line testing method according to claim 1, wherein the qualification identifies at least one of a topology and at least one bitrate of an xDSL modem.

6. The single ended line testing method according to claim 1, wherein the qualification identifies at least one of a cable loss and a defect of an xDSL-line.

7. The single ended line testing method according to claim 1, wherein the qualification identifies a line attenuation.

8. A single ended line testing device, comprising:
   a randomized signal generator generating and sending a plurality of randomized excitation signals from a first end of an xDSL line towards a second end of said line;
   a measuring component performing measurements, at said first end of said line, corresponding to each reflection of said plurality of randomized excitation signals sent towards said second end of said line;
   an inverse randomizer performing an inverse randomization on each said measurement of said reflections of said plurality of randomized excitation signals to obtain inversely randomized measurements; and
   a qualification component which determines a qualification of said line based on an average of a plurality of said inversely randomized measurements.

9. The single ended line testing device according to claim 8, wherein said randomized signal generator randomizes a phase of said excitation signals.

10. The single ended line testing device according to claim 8, wherein said randomized signal generator randomized an amplitude of said excitation signals.

11. The single ended line testing device according to claim 8, wherein said randomized signal generator randomizes both phase and amplitude of said excitation signals.

12. The single ended line testing device according to claim 8, wherein the qualification component identifies at least one of a topology and at least one bitrate of an xDSL modem.

13. The single ended line testing device according to claim 8, wherein the qualification component identifies at least one of a cable loss and a defect of an xDSL-line.

14. The single ended line testing device according to claim 8, wherein the qualification component identifies a line attenuation.

* * * * *